US006848073B2

(12) United States Patent
Hirzel et al.

(10) Patent No.: US 6,848,073 B2
(45) Date of Patent: Jan. 25, 2005

(54) TRELLIS ENCODING TECHNIQUE FOR PCM MODEMS

(75) Inventors: Frederic J. Hirzel, Sunnyvale, CA (US); Victor Demjanenko, Pendleton, NY (US)

(73) Assignee: Vocal Technologies, Ltd., Buffalo, NY (US)

( * ) Notice: Subject to any disclaimer, the term of this patent is extended or adjusted under 35 U.S.C. 154(b) by 0 days.

(21) Appl. No.: 09/973,483

(22) Filed: Oct. 8, 2001

(65) Prior Publication Data

US 2002/0157061 A1 Oct. 24, 2002

Related U.S. Application Data

(63) Continuation of application No. 09/093,704, filed on Jun. 9, 1998, now Pat. No. 6,301,683.
(60) Provisional application No. 60/049,107, filed on Jun. 9, 1997.

(51) Int. Cl.[7] .............................................. H03M 13/03
(52) U.S. Cl. ....................... 714/786; 714/755; 714/792; 375/265
(58) Field of Search ................................. 714/792, 755, 714/786, 783, 777, 778, 789; 375/222, 216, 265, 285, 295, 286, 342, 264, 231, 293, 371; 360/65; 341/59, 78, 94; 370/503, 535, 354

(56) References Cited

U.S. PATENT DOCUMENTS

| | | | |
|---|---|---|---|
| 4,891,806 A | * | 1/1990 | Farias et al. ................. 370/503 |
| 4,941,154 A | | 7/1990 | Wei |
| 4,980,897 A | | 12/1990 | Decker et al. |
| 5,119,403 A | | 6/1992 | Krishnan |
| 5,150,381 A | | 9/1992 | Forney, Jr. et al. |
| 5,233,629 A | | 8/1993 | Paik et al. |
| 5,249,200 A | | 9/1993 | Chen et al. |
| 5,251,236 A | | 10/1993 | Brehmer et al. |
| 5,295,142 A | | 3/1994 | Hatakeyama |
| 5,321,725 A | | 6/1994 | Paik et al. |
| 5,363,408 A | | 11/1994 | Paik et al. |
| 5,396,519 A | * | 3/1995 | Betts et al. ................. 375/296 |
| 5,398,073 A | | 3/1995 | Wei |
| 5,504,479 A | | 4/1996 | Doyle et al. |
| 5,509,021 A | * | 4/1996 | Todoroki ..................... 714/795 |
| 5,559,835 A | | 9/1996 | Betts |
| 5,659,578 A | | 8/1997 | Alamouti et al. |
| 5,706,312 A | | 1/1998 | Wei |
| 5,709,312 A | | 1/1998 | Lake |
| 5,790,570 A | | 8/1998 | Heegard et al. |
| 5,878,077 A | | 3/1999 | Betts |
| 5,953,376 A | | 9/1999 | Wei |
| 5,956,195 A | * | 9/1999 | Brickner et al. .............. 360/65 |
| 5,995,550 A | | 11/1999 | Xu et al. |

OTHER PUBLICATIONS

Kaminsky et al., *An eight–dimensional phase invariant trellis coded modulation scheme with constant envelope*, IEEE, Apr. 10, 1991.
Kaminsky et al., *Constant envelope eight–dimensional trellis coded modulation schemes*, IEEE, Jun. 1991.
Calderbank et al., *The normalized second moment of the binary lattice detrmined by a convolutional Code*, IEEE, Jan. 1994.
Chame, *A Digital Signal Processor Yields Enhanced Data/FAX Pump*, IEEE, 1997.
Rossi et al., *On the Symmetries and Structures of Trellis Codes*, IEEE, 1994.

\* cited by examiner

*Primary Examiner*—Guy J. Lamarre

(57) ABSTRACT

A method of applying a multidimensional error reduction/correction algorithm on a stream of one dimensional symbols, by converting the stream of one dimensional symbols into a corresponding stream of two dimensional symbols; and, applying the multidimensional error reduction/correction algorithm to the stream of two dimensional symbols. The invention also provides a method of normalizing a metric used by an error reduction/correction algorithm on a stream of symbols wherein the symbols are non-uniformly spaced, by: determining a minimum distance (dmin) between two closest symbols in the stream, for each symbol in the stream, determining a minimum distance (dsym) between each symbol in the stream and each of its adjacent neighboring symbols, and, normalizing the metric used by the error reduction/correction algorithm by the ratio dmin/dsym.

14 Claims, 2 Drawing Sheets

TRELLIS ENCODING TECHNIQUE FOR PCM MODEMS

Applicant hereby claims the benefit under 35 U.S.C. §119(e) of U.S. Provisional Application Ser. No. 60/049,107, filed Jun. 9, 1997. This application is a continuation of U.S. application Ser. No. 09/093,704, filed Jun. 9, 1998, now issued as U.S. Pat. No. 6,301,683, the entirety of which is incorporated herein by reference.

FIELD OF THE INVENTION

This invention relates generally to a trellis encoding technique for PCM modems. Even more particularly, this invention relates to a novel trellis encoding technique which is based upon International Telecommunication Union (ITU) Standard V.34, which is incorporated herein by reference. The trellis encoding technique described in V.34 is based upon a trellis coding method and arrangement disclosed in U.S. Pat. No. 4,941,154, also incorporated herein by reference.

BACKGROUND OF THE INVENTION

The use of trellis encoding has provided substantial advantages in digital communication. The use of trellis encoding on the analog downstream channel of PCM modems should provide similar advantages. Unfortunately, the non-equal spacing of PCM symbols results in the errors being concentrated only in those symbols with small adjacent symbol spacing.

This unequal distribution of symbol errors per symbol spacing reduces the advantages of trellis encoding. The throughput loss of including trellis state information can be compensated by an increase of throughput due to the ability to communicate error-free in a higher noise environment. Also, the use of trellis encoding may not be compatible with the variety of transmit gain and spectral shaping proposed by others.

What is needed is a trellis encoding technique which uses a modified V.34 trellis encoding for use with the analog downstream of PCM modems.

SUMMARY OF THE INVENTION

In accordance with one embodiment of the invention, four-dimensional error reduction/correction is performed on a stream of one dimensional transmit symbols. A transmit output is assigned to a transmit symbol and a one-dimensional subset label is concurrently assigned to the transmit symbol. Three one-dimensional subset labels for three previous transmit symbols are stored. A fourth transmit symbol is then formed such that an associated fourth one-dimensional subset label is partially determined by a combination of an output of an error reduction/correction algorithm and the three stored one-dimensional subset labels. The fourth transmit symbol is formed by mapping respective pairs of the fourth one-dimensional subset label and the three stored one-dimensional subset labels to produce first and second two-dimensional subset labels, mapping the first and second two-dimensional subset labels to produce a four-dimensional subset label, and providing the four-dimensional subset label as input to the error reduction/correction algorithm.

DETAILED DESCRIPTION OF THE PREFERRED EMBODIMENT

Figure 1:
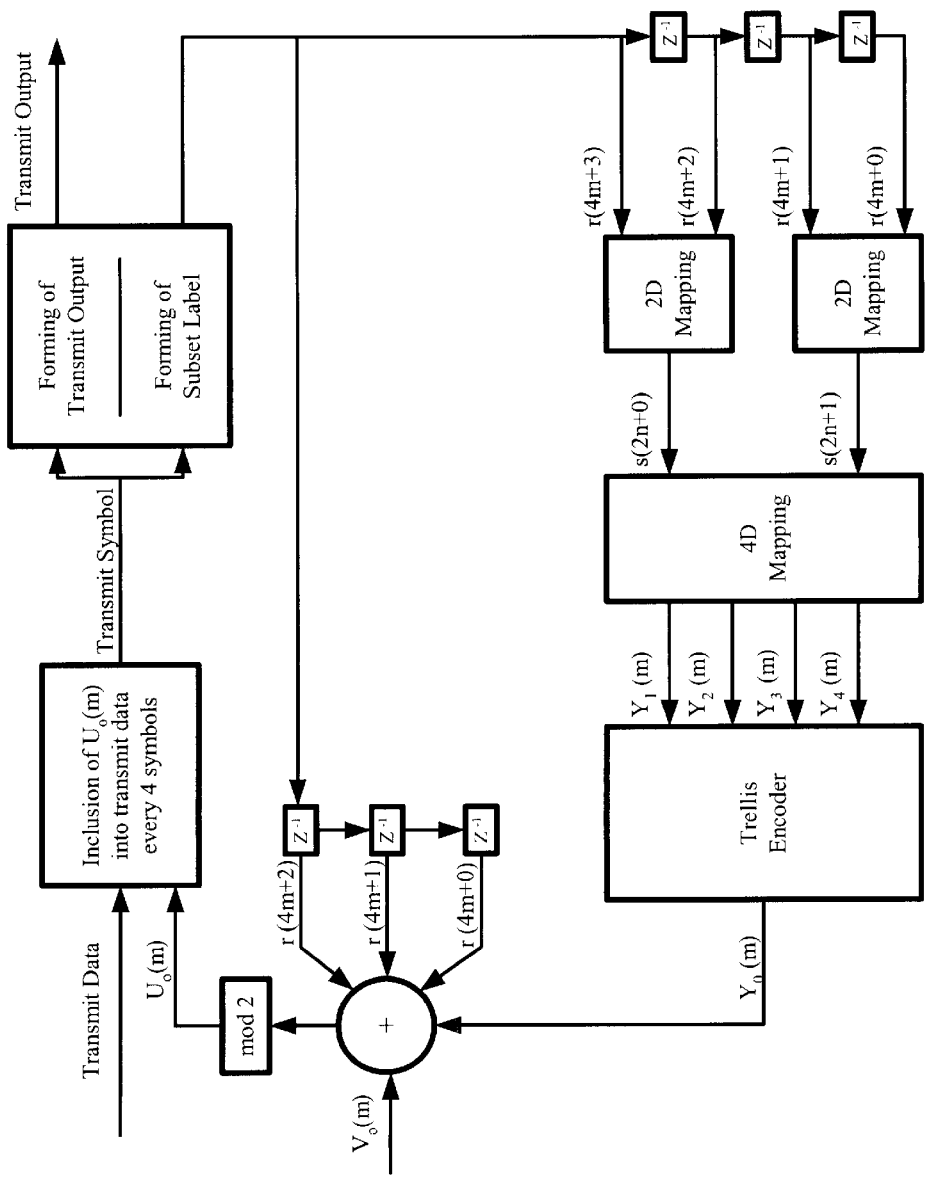
FIG. 1 illustrates an information processing system in a 1D trellis encoding device in accordance with an embodiment of the invention.

This application discloses a modified V.34 trellis encoding for use with the analog downstream of PCM modems. In the description which follows, the symbol "D" is defined to mean "dimension" or "dimensional". For example, "1D" means "one dimensional", etc. The V.34 trellis encoding is modified for the following PCM enhancements:

A. The 4D V.34 trellis encoding is modified for 1D symbols;
B. The input PCM symbol set is partitioned into four disjoint symbol sets;
C. The trellis decoder uses weighted error (metric) information; and
D. The use of a trellis encoder for any communication is optional.

Description of the 4D V.34 Trellis Encoder for 2D Symbols

The V.34 trellis encoder is constructed to operate on two 2D symbols. The process of trellis encoding is basically defined as follows: with m indicating each 4D period, n indicating each 2D period, and t being each 1D period being created respectively:

A. Generate the first trellis encoder input y(2m).
B. Calculate $U_0(m)$ which is function of $Y_0(m)$, $V_0(m)$, and $C_0(m)$.
C. Generate the second trellis encoder input y(2m+1) including the information encoded in $U_0(m)$.
D. Map y(2m) and y(2m+1) to 2D subset labels s(2m) and s(2m+1) respectively.
E. Using s(2m) and s(2m+1), convert the subset labels to the four inputs $Y_4(m)$, $Y_3(m)$, $Y_2(m)$, and $Y_1(m)$.
F. Run the chosen systematic convolutional encoder (16 state, 32 state, 64 state) to generate $Y_0(m+1)$.

Adaptation of the 4D V.34 Trellis Encoder for 1D Symbols

The adaptation to 1D symbols is simple. It is based upon the following observations:

A. The trellis encoding need not be 90 or even 180 degrees rotationally invariant. Thus, the analogous operation of $U_0(m)$, which affects the rotation of the V.34 symbol, can now perform a transmit symbol subset selection.
B. The entire V.34 trellis encoding structure, namely the subsets labels s(2m), s(2m+1), $Y_4(m)$, $Y_3(m)$, $Y_2(m)$, $Y_1(m)$, and $Y_0(m)$.
C. The V.34 trellis encoding structure is so constructed that the property: $U_0(m)$ equals bit 0 of (s(2m) s(2m+1)) is always satisfied.
D. Each 1D symbol can be treated as one of the independent variables of the 2D symbol y(n), either as its real or imaginary component.

The adaptation of the 4D trellis encoder to 1D symbols requires generation of subset labels analogous to the 2D s(n) subset labels. Using the notation r(t) to represent the 1D subset labels, all possible y(t) symbols are assigned r(t) values such that adjacent (in amplitude) y symbols have the following assignments:

smaller y values . . . larger y values
. . . 00011011 . . .

These assignments create four subset partitions of the set of y symbol's created.

The mapping from r(t) values is then, from figure 9/V.34:

TABLE 1

| r(n) | r(n), r(n + 1) to s(n) mapping r(n + 1) | | | |
|------|------|------|------|------|
|      | 00   | 01   | 10   | 11   |
| 11   | 001  | 110  | 101  | 010  |
| 10   | 100  | 011  | 000  | 111  |
| 01   | 101  | 010  | 001  | 110  |
| 00   | 000  | 111  | 100  | 011  |

An addition grouping of the four subsets of y is performed: those with r(t) values of 00,10, called the 0 grouping, and those with r(t) values of 01,11, called the 1 grouping.

The trellis encoding procedure is now:

A. Generate the first trellis encoder input and output symbol y(4m) selecting from any grouping. Map the symbol to its corresponding subset label r(4m).
B. Generate the second trellis encoder input and output symbol y(4m+1) selecting from any grouping. Map the symbol to its corresponding subset label r(4m+1).
C. Generate the third trellis encoder input and output symbol y(4m+2) selecting from any grouping. Map the symbol to its corresponding subset label r(4m+2).
D. Calculate the desired $U_0(m)$ which is defined as:

$$R_0(m) = \text{bit } 0 \ (r(4m) \oplus r(4m+1) \oplus r(4m+2)) \ U_0(m) = Y_0(m) \oplus V_0(m) \oplus R_0(m)$$

E. Generate the fourth trellis encoder input and output symbol y(4m+3). The symbol must come from the 0 grouping if $U_0(m)=0$ and from the 1 grouping if $U_0(m)=1$. Map the symbol to its corresponding subset label r(4m+3).
F. Using r(4m) and r(4m+1) to its respective s(2n) value. Using r(4m+2) and r(4m+3) to its respective s(2n+1) value.
G. Using s(2n) and s(2n+1), convert the subset labels to the four inputs $Y_4(m)$, $Y_3(m)$, $Y_2(m)$, and $Y_1(m)$.

Receiver Adaptation for PCM Encoding

The benefits of trellis encoding for PCM symbols can be further enhanced by scaling the metrics within the receiver. Normally, trellis encoding is used for communication systems with near equally spaced symbols for best performance over added white gaussian noise (AWGN) channels. The use of PCM codes result in symbols whose spacing is smaller for small and larger for large symbols. This results in an error on large symbols, which may be error-free without trellis encoding, to produce an error for smaller symbols.

The receiver can improve this problem. The smallest symbol spacing can be determined. This spacing, dmin, can be used to scale all other errors and hence metrics for differently spaced symbols. The scaling for any given symbol would become dmin/dsym where dsym is the spacing for a particular symbol.

This process results in large symbols contributing proportional rather than absolute information to the trellis decoding processes.

Trellis Coding Gain

The performance for equally spaced codes of the proposed trellis encoder is identical to that within V.34, approximately 4.5 dB. Unfortunately, the use of the proportionately spaced PCM codes results in less than this performance for low noise signals.

The proposed trellis encoder uses 1 bit every 4D symbol and costs 1/4 bit/symbol or 2000 bits/second to operate. For low noise receive signals, it only improves the performance of those few symbols with minimum receive spacing. If the additional codes allowed by the better S/N performance does not create more than an additional 1/4 bit/symbol in performance, the use of the trellis encoder is counterproductive.

For high noise receive signals, of course, the use of this trellis encoding will result in large throughput gains. Under noise representing throughput rates of 30 Kbps, the improvement can be over 4 KBps.

Because of this difference of performance of the use of trellis encoding for low and high noise PCM environments, the use of the trellis encoding should be optional. A receiver experiencing low noise can request no trellis encoding. A receiver experiencing high noise can request whatever trellis encoding it implements.

In summary, this invention describes a practical method of adapting trellis encoding for the downstream signal on PCM modems. The trellis encoder described is simply the V.34 adapted for 1D symbols. It describes improvements the receiver can make to make the trellis decoding less sensitive to the proportionally spaced PCM coded symbols. It also describes the effect low and high noise signals has on the use of trellis encoding coding gain for PCM coded symbol.

The incorporation of trellis encoding has significant advantages for high noise signals and, as such, should be incorporated into the PCM modem specification. Because of its small benefits for low noise signals, though, the specification should allow the negotiation of no trellis encoding. The PCM receiver should determine the acceptability of using trellis encoding.

Figure 2:
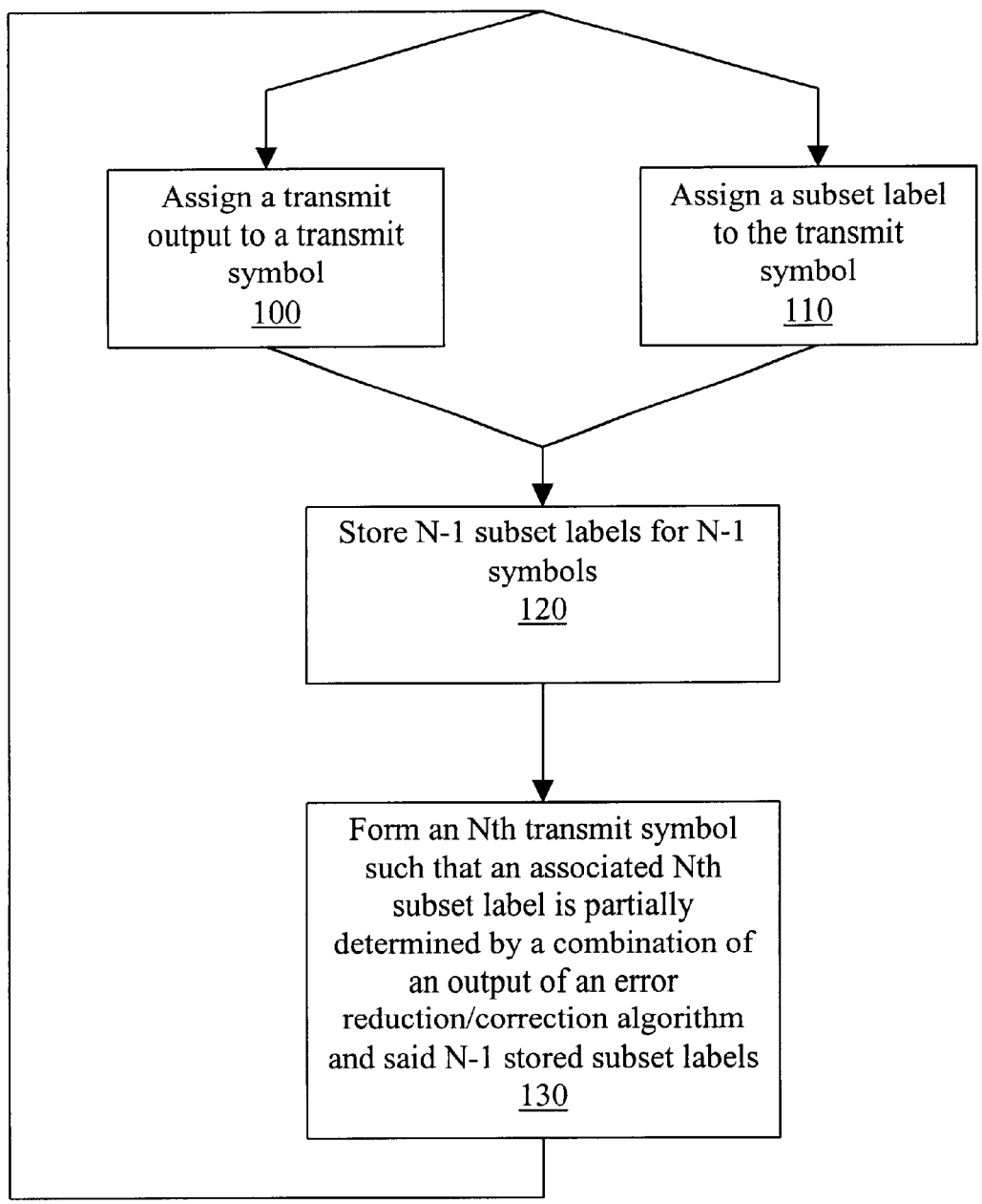
FIG. 2 illustrates a process in accordance with an embodiment of the invention.

A recursive process in accordance with an embodiment of the invention is shown in FIG. 2, making reference to FIG. 1 which shows an information processing system in a 1D trellis encoding device in accordance with the foregoing description. In the process illustrated in FIG. 2, a transmit output is assigned (100) to a transmit symbol. Concurrently, a subset label is assigned (110) to the transmit symbol. N−1 subset labels are stored (120) for N−1 transmit symbols. Thus, an Nth transmit symbol is formed (130) such that an associated Nth subset label is partially determined by a combination of an output of an error reduction/correction algorithm and said N−1 stored subset labels. The transmit symbols and their assigned transmit outputs and subset labels are illustrated in FIG. 1.

These and other objects, features and advantages of the present invention will be readily apparent to those having ordinary skill in the art. For example, although a metric normalization method described above is based upon the determination of certain minimum distances between symbols in the stream, it will be appreciated that other normalization methods are also possible, based but not limited, for example, on signal level corresponding to amplitude or a function of amplitude.

What is claimed is:

1. A method of performing four-dimensional error reduction/correction on a stream of one dimensional transmit symbols, comprising:

assigning a transmit output to a transmit symbol;
concurrently assigning a one-dimensional subset label to said transmit symbol;
storing three one-dimensional subset labels for three transmit symbols; and
forming fourth transmit symbol such that an associated fourth one-dimensional subset label is partially determined by a combination of an output of an error reduction/correction algorithm and said three stored one-dimensional subset labels, wherein forming the fourth transmit symbol comprises:

mapping respective pairs of one-dimensional subset labels selected from said fourth one-dimensional subset label and said three stored one-dimensional subset labels to produce first and second two-dimensional subset labels;

mapping said first and second two-dimensional subset labels to produce a four-dimensional subset label; and providing said four-dimensional subset label as input to said error reduction/correction algorithm.

2. The method recited in claim 1, wherein said error reduction/correction algorithm is performed by a trellis encoder.

3. The method recited in claim 1, wherein said error reduction/correction algorithm is performed by a systematic convolutional encoder.

4. The method recited in claim 1, wherein assigning a one-dimensional subset label to said transmit symbol comprises:

ordering transmit outputs by value; and assigning one-dimensional subset labels to said transmit outputs in sequence.

5. The method recited in claim 4, wherein ordering transmit outputs by value is performed according to increasing value of said transmit outputs.

6. The method recited in claim 4, wherein assigning subset labels in sequence is performed according to ascending values of said subset labels.

7. The method recited in claim 1, wherein forming said fourth transmit symbol further comprises:

computing $U_0$ as a combination of an output of an error reduction/correction encoder performing said error reduction/correction algorithm and said three stored one-dimensional subset labels; and forming said fourth transmit symbol such that a bit 0 of said associated fourth one-dimensional subset label is determined by $U_0$.

8. The method recited in claim 7, wherein said error reduction/correction encoder is a trellis encoder.

9. The method recited in claim 7, wherein computing $U_0$ comprises determining a sum modulo 2 of said output of said error reduction/correction encoder and said three stored one-dimensional subset labels.

10. The method recited in claim 7, wherein said fourth transmit symbol is formed such that bit 0 of its associated fourth one-dimensional subset label is equal to $U_0$.

11. The method recited in claim 1, wherein forming said fourth transmit symbol further comprises:

generating a verification sequence bit $V_0$;

computing $U_0$ as a combination of a previous encoder output of an error reduction/correction encoder, said three stored one-dimensional subset labels and a verification sequence bit $V_0$; and forming said fourth transmit symbol such that a bit 0 of its associated one-dimensional subset label is determined by $U_0$.

12. A method of performing four-dimensional error reduction/correction on a stream of one dimensional transmit symbols, comprising:

assigning a transmit output to a transmit symbol;

concurrently assigning a subset label to said transmit symbol, wherein transmit outputs are ordered by increasing value and subset labels are in ascending order;

forming a first transmit symbol at a time 4m+0, where m is an integer, from input data and storing a subset label r(4m+0) associated with said first transmit symbol;

forming a second transmit symbol at a time 4m+1 from input data and storing a subset label r(4m+1) associated with the second transmit symbol;

forming a third transmit symbol at a time 4m+2 from input data and storing a subset label r(4m+2) associated with the third transmit symbol;

computing $U_0(m)$ as a sum modulo 2 of a previous output $Y_0(m)$ of a trellis encoder and said stored subset labels r(4m +0), r(4m+1) and r(4m+2), according to the equation $U_0(m)=Y_0(m) \oplus r(4m+0) \oplus r(4m+1) \oplus r(4m+2)$;

forming a fourth transmit symbol at a time 4m+3 from input data and $U_0(m)$ such that a bit 0 of a subset label r(4m+3) associated with the fourth transmit symbol is determined by $U_0(m)$;

mapping a pair of subset labels r(4m+0) and r(4m+1) to a secondary subset label s(2n+0) and further mapping a pair of subset labels r(4m+2) and r(4m+3) to a secondary subset label s(2n+1), where 2n=4m;

mapping a pair of secondary subset labels s(2n+0) and s(2n+1) to inputs of said trellis encoder $Y_1(m)$, $Y_2(m)$, $Y_3(m)$ and $Y_4(m)$, and;

calculating an output of said trellis encoder $Y_0(m+1)$ from said input bits $Y_1(m)$, $Y_2(m)$, $Y_3(m)$ and $Y_4(m)$.

13. A method of applying a four-dimensional error reduction/correction algorithm on a stream of one-dimensional symbols, comprising:

converting pairs of symbols of said stream of one-dimensional symbols to corresponding two-dimensional symbols;

converting a pair of said two-dimensional symbols into a corresponding four-dimensional symbol;

providing said four-dimensional symbol as input to said error reduction/correction algorithm; and forming a one-dimensional symbol of said stream of symbols that is partially determined by an output of the error reduction/correction algorithm.

14. A communication device performing error correction/reduction accordance with the method recited in claim 13.

* * * * *